(12) United States Patent
Xiao et al.

(10) Patent No.: US 10,540,937 B2
(45) Date of Patent: Jan. 21, 2020

(54) GOA CIRCUIT

(71) Applicant: Wuhan China Star Optoelectronics Technology Co., Ltd., Wuhan, Hubei (CN)

(72) Inventors: Juncheng Xiao, Hubei (CN); Yanqing Guan, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 142 days.

(21) Appl. No.: 15/745,098

(22) PCT Filed: Nov. 27, 2017

(86) PCT No.: PCT/CN2017/113110
§ 371 (c)(1),
(2) Date: Jan. 15, 2018

(87) PCT Pub. No.: WO2019/095429
PCT Pub. Date: May 23, 2019

(65) Prior Publication Data
US 2019/0156777 A1 May 23, 2019

(30) Foreign Application Priority Data

Nov. 17, 2017 (CN) .......................... 2017 1 1147120

(51) Int. Cl.
*G09G 3/36* (2006.01)
*G02F 1/1345* (2006.01)
*H01L 27/12* (2006.01)

(52) U.S. Cl.
CPC ....... *G09G 3/3677* (2013.01); *G02F 1/13454* (2013.01); *H01L 27/124* (2013.01);
(Continued)

(58) Field of Classification Search
CPC ......... G09G 3/3677; G09G 2300/0426; G09G 2300/0408; G09G 2300/0809; G09G 2310/08; G02F 1/13454; H01L 27/124
See application file for complete search history.

(56) References Cited

U.S. PATENT DOCUMENTS 7,486,269 B2 * 2/2009 Moon .................. G09G 3/3677
345/100
10,339,887 B1 * 7/2019 Hong .................... G06F 3/0412
(Continued)

FOREIGN PATENT DOCUMENTS

| CN | 105206237 A | 12/2015 |
|----|-------------|---------|
| CN | 205122157 U | 3/2016 |
| CN | 105976781 A | 9/2016 |

*Primary Examiner* — Amare Mengistu
*Assistant Examiner* — Crystal Mathews
(74) *Attorney, Agent, or Firm* — Hemisphere Law, PLLC; Zhigang Ma

(57) ABSTRACT

This invention provides a GOA circuit comprising m cascaded GOA units. An n-th GOA unit includes an output control module, a forward/backward scanning control module, a node signal control module, a second pull-down circuit, a first pull-down circuit and a pull-up circuit. The forward/backward scanning control module control the GOA circuit to perform a forward or a backward scanning. The output control module controls an output of an n-th gate driving signal. The first pull-down circuit comprises a seventh thin film transistor. The second pull-down circuit comprises a fifth thin film transistor. The node signal control module control the fifth thin film transistor. The pull-up circuit includes an eighth thin film transistor. After the LCD panel is powered off, the second global control signal becomes a low level. This invention can eliminate a ghost image in the LCD panel when electricity is powered off, and improve user experience.

17 Claims, 2 Drawing Sheets

(52) U.S. Cl.
CPC ............... *G09G 2300/0408* (2013.01); *G09G 2300/0426* (2013.01); *G09G 2300/0809* (2013.01); *G09G 2310/08* (2013.01)

(56) References Cited

U.S. PATENT DOCUMENTS

| | | | | |
|---|---|---|---|---|
| 2015/0043703 | A1* | 2/2015 | Tan | G11C 19/28 377/68 |
| 2016/0189647 | A1* | 6/2016 | Xiao | G09G 3/3677 345/92 |
| 2016/0189648 | A1* | 6/2016 | Xiao | G09G 3/3677 345/212 |
| 2016/0189649 | A1* | 6/2016 | Xiao | G11C 19/28 345/214 |
| 2016/0358566 | A1* | 12/2016 | Li | G11C 19/28 |
| 2019/0073987 | A1* | 3/2019 | Lin | G09G 5/393 |
| 2019/0130858 | A1* | 5/2019 | Xiao | G09G 3/3677 |

* cited by examiner

GOA CIRCUIT

RELATED APPLICATIONS

The present application is a National Phase of International Application Number PCT/CN2017/113110, filed Nov. 27, 2017, and claims the priority of China Application No. 201711147120.4, filed Nov. 17, 2017.

FIELD OF THE DISCLOSURE

The disclosure relates to a field of display technology, and more particularly to a GOA circuit.

BACKGROUND

Currently, the liquid crystal display device has been widely used as a display component of electronic devices in various electronic products. The GOA (Gate Driver On Array) circuit is an important part of a liquid crystal display device. The GOA circuit is a technology that uses a process for existing thin film transistor liquid crystal display array to manufacture a gate line scan driving signal circuit on an array substrate to realize a gate-by-gate scan driving method.

The display panel based on Low Temperature Poly-silicon (LTPS) technology can be divided into an NMOS type, a PMOS type and a combination of NMOS and NMOS according to a type of a thin film transistor (TFT) used in the panel. Similarly, the GOA circuit can be divided into a NMOS circuit, a PMOS circuit and a CMOS circuit. The NMOS circuit, in comparison to the CMOS circuit, is of great benefit in terms of improving the yield and reducing cost, due to the omission of PP (P doping, i.e., phosphorus ions doping) mask and process. To develop the stable NMOS circuit has realistic industry needs. In the case of abnormal power off, if the GOA circuit cannot effectively achieve the function of All Gate ON, i.e., all the gate driving signals in the GOA circuit being set to an active potential for scanning the liquid crystal display device simultaneously, the panel will have a ghost image.

For example, taking a forward scan as an example, in the GOA circuit unit shown in FIG. 1, when an abnormal power-off is triggered, if the (n+1)th clock signal accessed to the thin film transistor NT3 is at a high level, the forward scan control signal and the (n+1)th clock signal will be pulled down to a low level simultaneously. As a result, the high potential of the gate of the thin film transistor NT5 is not able to be reset, and thus the thin film transistor NT5 remains turn-on. In the meanwhile, since a thin film transistor NT8 is also on a turn-on state, a high-level signal VGH is superimposed with a low-level signal VGL, and the gate of the thin film transistor NT7 cannot be pulled down completely, causing the thin film transistor NT7 to pull down the gate driving signal G(n) output to the thin film transistor of the pixel unit. The gate driving signal G(n) is thus insufficient to turn on the thin film transistor of the pixel unit, and the charge of the pixel electrode cannot be released in time, resulting in the ghost image occurring in the effective display area during the abnormal power-off.

SUMMARY

In order to solve the above technical problem, the present invention provides a GOA circuit, which can eliminate the ghost image that occurs when the liquid crystal display panel is abnormally powered off and improve the user experience.

The GOA circuit provided in the present invention is applied to a liquid crystal display panel and includes m cascaded GOA units. An n-th GOA unit includes an output control module, a forward and backward scanning control module, a node signal control module, a second pull-down circuit, a first pull-down circuit and a pull-up circuit, wherein m≥n≥1.

The forward and backward scanning control module is configured to control the GOA circuit to perform a forward scanning or a backward scanning according to a forward scanning control signal or a backward scanning control signal.

The output control module is connected to the forward and backward scanning control module and is configured to control an output of an n-th gate driving signal during the forward scanning or the backward scanning in the GOA circuit.

The first pull-down circuit comprises a seventh thin film transistor, a first terminal of the seventh thin film transistor is connected with the output control module, and a second terminal of the seventh thin film transistor is connected with a low-level signal.

The second pull-down circuit comprises a fifth thin film transistor, a first terminal of the fifth thin film transistor is connected to a second global control signal, and a second terminal of the fifth thin film transistor is connected to a third terminal of the seventh thin film transistor.

The node signal control module is connected to a third terminal of the fifth thin film transistor and configured to output a clock signal to the fifth thin film transistor so as to control the ON-OFF of the fifth thin film transistor.

The pull-up circuit includes an eighth thin film transistor having a first terminal connected to the third terminal of the seventh thin film transistor, a second terminal and a third terminal respectively connected to a low-level signal and a first global control signal.

The first terminal is one of a source and a drain, the second terminal is the other of the source and the drain, and the third terminal is a gate. After the liquid crystal display panel is powered off, the second global control signal is at a low level.

Preferably, the pull-up circuit further comprises a thirteenth TFT.

A first terminal and a third terminal of the thirteenth TFT are both connected to the third terminal of the eighth TFT, and a second terminal of the thirteenth TFT is connected to the first terminal of the seventh TFT.

Preferably, the GOA unit further comprises a voltage regulator circuit.

The voltage regulator circuit comprises a ninth TFT, the output control module comprises a sixth TFT, and the forward and backward scanning control module comprises a first TFT and a second TFT.

A first terminal of the first thin film transistor is connected to a forward scanning control signal and a second terminal of the first thin film transistor is connected to a first terminal of the ninth thin film transistor.

A third terminal of the ninth thin film transistor is connected with a high-level signal, and a second terminal of the ninth thin film transistor is connected with a third terminal of the sixth thin film transistor.

A first terminal of the sixth thin film transistor is connected to an n-th clock signal, a second terminal of the sixth thin film transistor is connected to the first terminal of the seventh thin film transistor, and a connection point of the sixth thin film transistor and the seventh thin film transistor works as an output terminal of a gate drive signal of stage n.

A first terminal of the second thin film transistor is connected with a backward scanning control signal, and a second terminal of the second thin film transistor is connected with a second terminal of the first thin film transistor.

When n>2, the third terminal of the first thin film transistor is inputted by a gate driving signal of stage n−2, and when n≤2, the third terminal of the first thin film transistor is inputted by a scan enabling signal.

When n≤m−2, the third terminal of the second thin film transistor is inputted by a gate driving signal of stage n+2, and when n>m−2, the third terminal of the second thin film transistor is inputted by the scan enabling signal.

After the liquid crystal display panel is powered off, the scan enabling signal is at a high level.

Preferably, the node signal control module comprises a third thin film transistor and a fourth thin film transistor.

A first terminal of the third TFT is inputted by an (n+1)th clock signal, a third terminal of the third TFT is inputted by a forward scan control signal, and a second terminal of the third TFT is connected to a third terminal of the fifth thin film transistor.

A first terminal of the fourth thin film transistor is inputted by an (n−1)th clock signal, a third terminal of the fourth TFT is inputted by a backward scanning control signal, and a second terminal of the fourth thin film transistor is connected with a third terminal of the fifth thin film transistor.

Preferably, the GOA circuit has a total of four clock signals: a first clock signal, a second clock signal, a third clock signal and a fourth clock signal. When the n-th clock signal is the fourth clock signal, the (n+1)th clock signal is the first clock signals, and when the n-th clock signal is the first clock signal, the (n−1)th clock signal is the fourth clock.

Preferably, the GOA unit further comprises a first capacitor, a second capacitor and a tenth thin film transistor.

A third terminal of the tenth thin film transistor is connected to the second terminal of the fifth thin film transistor, a first terminal and a second terminal of the tenth thin film transistor are respectively connected to the first terminal of the ninth thin film transistor and a low-level signal.

Both ends of the first capacitor are respectively connected to a first terminal of the ninth TFT and a low-level signal.

Both ends of the second capacitor are respectively connected to the third terminal and the second terminal of the seventh TFT.

Preferably, the GOA unit further comprises a twelfth thin film transistor and an eleventh thin film transistor.

A third terminal of the twelfth thin film transistor is connected to the second terminal of the first thin film transistor and the second terminal of the second thin film transistor, and a second terminal and a first terminal of the twelfth thin film transistor are respectively connected to a low-level signal and a third terminal of the seventh thin film transistor.

A third terminal of and a second terminal of the eleventh TFT are connected together and to a reset signal, and a first terminal of the eleventh TFT is connected to the third terminal of the seventh TFT.

Preferably, all the thin film transistors of the GOA unit are N-channel thin film transistors.

Preferably, after the liquid crystal display panel is powered off, the forward scanning control signal, the backward scanning control signal and all the clock signals are at a low level, and the first global control signal is at a high level.

The present invention further provides a GOA circuit provided that is applied to a liquid crystal display panel and includes m cascaded GOA units. An n-th GOA unit includes an output control module, a forward and backward scanning control module, a node signal control module, a second pull-down circuit, a first pull-down circuit and a pull-up circuit, wherein m≥m≥1.

The forward and backward scanning control module is configured to control the GOA circuit to perform a forward scanning or a backward scanning according to a forward scanning control signal or a backward scanning control signal.

The output control module is connected to the forward and backward scanning control module and is configured to control an output of an n-th gate driving signal during the forward scanning or the backward scanning in the GOA circuit.

The first pull-down circuit comprises a seventh thin film transistor, a first terminal of the seventh thin film transistor is connected with the output control module, and a second terminal of the seventh thin film transistor is connected with a low-level signal.

The second pull-down circuit comprises a fifth thin film transistor, a first terminal of the fifth thin film transistor is connected to a second global control signal, and a second terminal of the fifth thin film transistor is connected to a third terminal of the seventh thin film transistor.

The node signal control module is connected to a third terminal of the fifth thin film transistor and configured to output a clock signal to the fifth thin film transistor so as to control the ON-OFF of the fifth thin film transistor.

The pull-up circuit includes an eighth thin film transistor having a first terminal connected to the third terminal of the seventh thin film transistor, a second terminal and a third terminal respectively connected to a low-level signal and a first global control signal.

Preferably, the pull-up circuit further comprises a thirteenth TFT.

A first terminal and a third terminal of the thirteenth TFT are both connected to the third terminal of the eighth TFT, and a second terminal of the thirteenth TFT is connected to the first terminal of the seventh TFT.

The first terminal is one of a source and a drain, the second terminal is the other of the source and the drain, and the third terminal is a gate. After the liquid crystal display panel is powered off, the second global control signal is at a low level.

Preferably, the GOA unit further comprises a voltage regulator circuit.

The voltage regulator circuit comprises a ninth TFT, the output control module comprises a sixth TFT, and the forward and backward scanning control module comprises a first TFT and a second TFT.

A first terminal of the first thin film transistor is connected to a forward scanning control signal and a second terminal of the first thin film transistor is connected to a first terminal of the ninth thin film transistor.

A third terminal of the ninth thin film transistor is connected with a high-level signal, and a second terminal of the ninth thin film transistor is connected with a third terminal of the sixth thin film transistor.

A first terminal of the sixth thin film transistor is connected to an n-th clock signal, a second terminal of the sixth thin film transistor is connected to the first terminal of the seventh thin film transistor, and a connection point of the sixth thin film transistor and the seventh thin film transistor works as an output terminal of a gate drive signal of stage n.

A first terminal of the second thin film transistor is connected with a backward scanning control signal, and a second terminal of the second thin film transistor is connected with a second terminal of the first thin film transistor.

When n>2, the third terminal of the first thin film transistor is inputted by a gate driving signal of stage n−2, and when n≤2, the third terminal of the first thin film transistor is inputted by a scan enabling signal.

When n≤m−2, the third terminal of the second thin film transistor is inputted by a gate driving signal of stage n+2, and when n>m−2, the third terminal of the second thin film transistor is inputted by the scan enabling signal.

After the liquid crystal display panel is powered off, the scan enabling signal is at a high level.

Preferably, the node signal control module comprises a third thin film transistor and a fourth thin film transistor.

A first terminal of the third TFT is inputted by an (n+1)th clock signal, a third terminal of the third TFT is inputted by a forward scan control signal, and a second terminal of the third TFT is connected to a third terminal of the fifth thin film transistor.

A first terminal of the fourth thin film transistor is inputted by (n−1)th clock signal, a third terminal of the fourth TFT is inputted by a backward scanning control signal, and a second terminal of the fourth thin film transistor is connected with a third terminal of the fifth thin film transistor.

Preferably, the GOA circuit has a total of four clock signals: a first clock signal, a second clock signal, a third clock signal and a fourth clock signal. When the n-th clock signal is the fourth clock signal, the (n+1)th clock signal is the first clock signals, and when the n-th clock signal is the first clock signal, the (n−1)th clock signal is the fourth clock.

Preferably, the GOA unit further comprises a first capacitor, a second capacitor and a tenth thin film transistor.

A third terminal of the tenth thin film transistor is connected to the second terminal of the fifth thin film transistor, a first terminal and a second terminal of the tenth thin film transistor are respectively connected to the first terminal of the ninth thin film transistor and a low-level signal.

Both ends of the first capacitor are respectively connected to a first terminal of the ninth TFT and a low-level signal.

Both ends of the second capacitor are respectively connected to the third terminal and the second terminal of the seventh TFT.

Preferably, the GOA unit u her comprises a twelfth thin film transistor and an eleventh thin film transistor.

A third terminal of the twelfth thin film transistor is connected to the second terminal of the first thin film transistor and the second terminal of the second thin film transistor, and a second terminal and a first terminal of the twelfth thin film transistor are respectively connected to a low-level signal and a third terminal of the seventh thin film transistor.

A third terminal of and a second terminal of the eleventh TFT is connected to is connected to a reset signal, and a first terminal of the eleventh TFT is connected to the third terminal of the seventh TFT.

Preferably, all the thin film transistors of the GOA unit are N-channel thin film transistors.

Preferably, after the liquid crystal display panel is powered off, the forward scanning control signal, the backward scanning control signal and all the clock signals are at a low level, and the first global control signal is at a high level.

The implementation of the present invention has the following beneficial effects. In the present invention, by means of inputting the second global control signal GAS2 to the first terminal of the fifth TFT NT5, the second global control signal GAS2 becomes a low level when the liquid crystal display panel is powered off. Thus, even though the fifth thin film transistor NT5 is turned on in such a situation and the second global control signal GAS2 is transmitted to the seventh thin film transistor NT7, the low-level signal VGL will flow into the gate of the seventh thin film transistor NT7 through the eighth thin film transistor NT8. The low-level signal VGL thus superimpose the second global control signals GAS2, and turn off the seventh thin film transistor NT7, which can prevent the low-level signal VGL from pulling down the potential of the gate driving signal G(n) of stage n, thereby avoiding insufficient opening of the thin film transistor of the pixel unit resulted from that the gate driving signal G(n) of stage n is pulled low.

Therefore, in the present application, the pixel switch of the liquid crystal display panel can be fully opened to release the charge on the pixel electrode in time, and the charge of the pixel electrode can be led out through the data line of the liquid crystal display panel, which in turn eliminates a ghost image in the liquid crystal display panel that appears when the electricity is powered off, and improve user experience.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
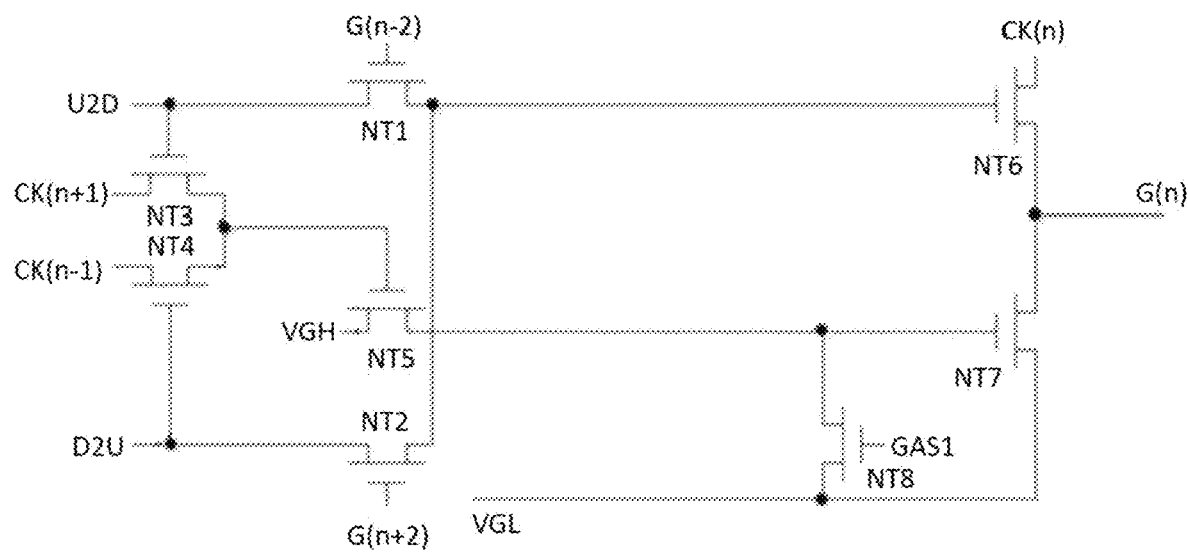
FIG. 1 is a circuit diagram of an nth GOA unit in a GOA circuit in prior art.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Figure 2:
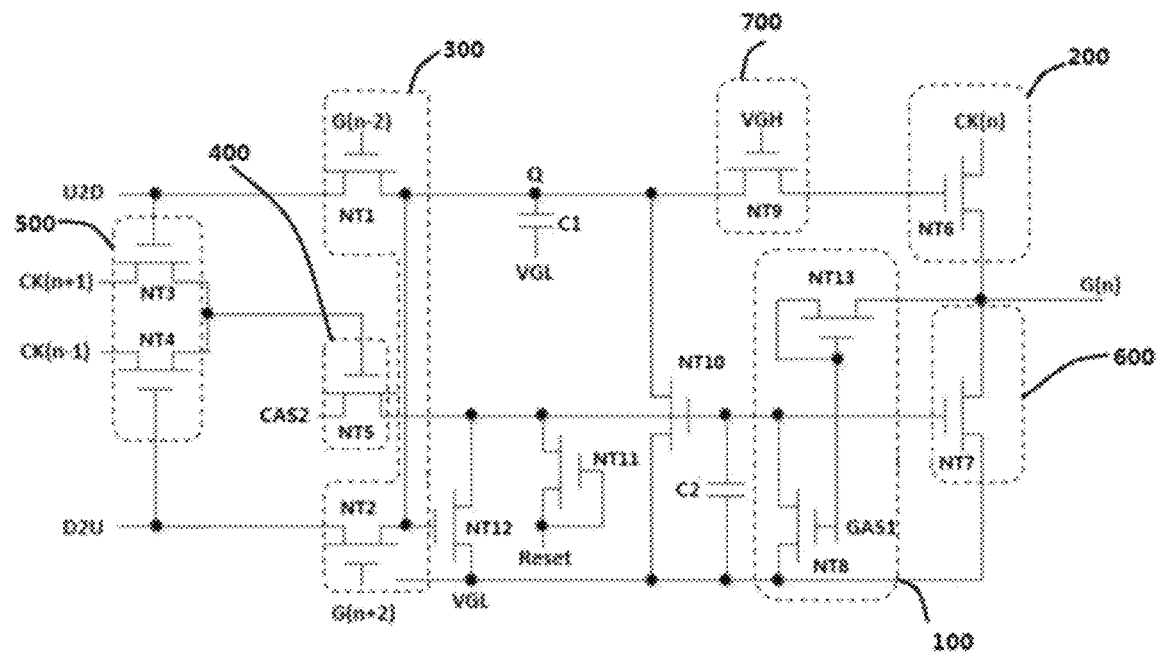
FIG. 2 is a circuit diagram of an n-th GOA unit in a GOA circuit provided by the present invention.

The present invention provides a GOA circuit applied to a liquid crystal display panel. The GOA circuit comprises m cascaded GOA units. As shown in FIG. 2, an n-th GOA unit includes an output control module 200, a forward and backward scanning control module 300, a node signal control module 500, a second pull-down circuit 400, a first pull-down circuit 600 and a pull-up circuit 100, wherein m≥n≥1.

The forward and backward scanning control module 300 is configured to control the GOA circuit to perform a forward scanning or a backward scanning according to a forward scanning control signal U2D or a backward scanning control signal D2U.

The output control module 200 is connected to the forward and backward scanning control module 300 and is configured to control an output of a gate driving signal G(n) of stage n during the forward scanning or the backward scanning in the GOA circuit. The output control module 200 is configured to deliver the n-th gate driving signal G(n), through a gate line, to a thin film transistor (i.e., the pixel switch) of the pixel unit connected to the gate line.

The first pull-down circuit 600 comprises a seventh thin film transistor NT7, a first terminal of the seventh thin film transistor NT7 is connected with the output control module 200, and a second terminal of the seventh thin film transistor NT7 is connected with a low-level signal VGL.

The second pull-down circuit 400 comprises a fifth thin film transistor NT5. A first terminal of the fifth thin film transistor NT5 is connected to a second global control signal GAS2, and a second terminal of the fifth thin film transistor NT5 is connected to a third terminal of the seventh thin film transistor NT7.

The node signal control module 500 is connected to a third terminal of the fifth thin film transistor NT5 and configured to output a clock signal to the fifth thin film transistor NT5 so as to control the ON-OFF of the fifth thin film transistor NT5.

The pull-up circuit 100 includes an eighth thin film transistor NT8 having a first terminal connected to the third terminal of the seventh thin film transistor NT7, a second terminal and a third terminal respectively connected to a low-level signal VGL and a first global control signal GAS1.

The first terminal is one of a source and a drain, the second terminal is the other of the source and the drain, and the third terminal is a gate. After the liquid crystal display panel is powered off, the second global control signal GAS2 is at a low level.

Preferably, the pull-up circuit 100 further comprises a thirteenth TFT NT13.

A first terminal and a third terminal of the thirteenth TFT NT13 are both connected to the third terminal of the eighth TFT NT8, and a second terminal of the thirteenth TFT NT13 is connected to the first terminal of the seventh TFT NT7.

Preferably, the GOA unit further comprises a voltage regulator circuit 700.

The voltage regulator circuit 700 comprises a ninth TFT NT9. The output control module 200 comprises a sixth TFT NT6, The forward and backward scanning control module 300 comprises a first TFT NT1 and a second TFT NT2.

A first terminal of the first thin film transistor NT1 is connected to a forward scanning control signal U2D and a second terminal of the first thin film transistor NT1 is connected to a first terminal of the ninth thin film transistor NT9.

A third terminal of the ninth thin film transistor NT9 is connected with a high-level signal VGH, and a second terminal of the ninth thin film transistor NT9 is connected with a third terminal of the sixth thin film transistor NT6.

A first terminal of the sixth thin film transistor NT6 is connected to an n-th clock signal. A second terminal of the sixth thin film transistor NT6 is connected to the first terminal of the seventh thin film transistor NT7. A connection point of the sixth thin film transistor NT6 and the seventh thin film transistor NT7 works as an output terminal of a gate drive signal G(n) of stage n.

A first terminal of the second thin film transistor NT2 is connected with a backward scanning control signal D2U, and a second terminal of the second thin film transistor NT2 is connected with a second terminal of the first thin film transistor NT1.

When n>2, the third terminal of the first thin film transistor NT1 is inputted by a gate driving signal G(n−2) of stage n−2, and when n≤2, the third terminal of the first thin film transistor NT1 is inputted by a scan enabling signal.

When n≤m−2, the third terminal of the second thin film transistor NT2 is inputted by a gate driving signal G(n+2) of stage n+2, and when n>m−2, the third terminal of the second thin film transistor NT2 is inputted by the scan enabling signal.

After the liquid crystal display panel is powered off, the scan enabling signal is at a high level.

Preferably, the node signal control module 500 comprises a third thin film transistor NT3 and a fourth thin film transistor NT4.

A first terminal of the third TFT NT3 is inputted by an (n+1)th clock signal CK(n+1), a third terminal of the third TFT NT3 is inputted by a forward scan control signal U2D, and a second terminal of the third TFT NT3 is connected to a third terminal of the fifth thin film transistor NT5.

A first terminal of the fourth thin film transistor NT4 is inputted by an (n−1)th clock signal CK(n−1), a third terminal of the fourth TFT NT4 is inputted by a backward scanning control signal D2U, and a second terminal of the fourth thin film transistor NT4 is connected with a third terminal of the fifth thin film transistor NT5.

Preferably, the GOA circuit has a total of four clock signals CK: a first clock signal, a second clock signal, a third clock signal and a fourth clock signal. When the n-th clock signal is the fourth clock signal, the (n+1)th clock signal is the first clock signals, and when the n-th clock signal is the first clock signal, the (n−1)th clock signal is the fourth clock. If the node signal control module 500 of the n-th GOA unit is inputted by the first and third clock signals, the node signal control module 500 of the (n+1)th GOA unit is inputted by the second and the fourth clock signals. Therefore, the GOA unit of stage n and the GOA unit of stage (n+1) can jointly form one GOA repeat unit.

Preferably, the GOA unit further comprises a first capacitor C1, a second capacitor C2 and a tenth thin film transistor NT10. The tenth thin film transistor NT10 is used for controlling the potential of the gate of the sixth thin film transistor NT6. The first capacitor C1 and the second capacitor C2 are used to store charges.

A third terminal of the tenth thin film transistor NT10 is connected to the second terminal of the fifth thin film transistor NT5. A first terminal and a second terminal of the tenth thin film transistor NT10 are respectively connected to the first terminal of the ninth thin film transistor NT9 and a low-level signal VGL.

Both ends of the first capacitor C1 are respectively connected to a first terminal of the ninth TFT NT9 and the low-level signal VGL.

Both ends of the second capacitor C2 are respectively connected to the third terminal and the second terminal of the seventh TFT NT7.

Preferably, the GOA unit further comprises a twelfth thin film transistor NT12 and an eleventh thin film transistor NT11.

A third terminal of the twelfth thin film transistor NT12 is connected to the second terminal of the first thin film transistor NT1 and the second terminal of the second thin film transistor NT2. A second terminal and a first terminal of the twelfth thin film transistor NT12 are respectively connected to the low-level signal VGL and a third terminal of the seventh thin film transistor NT7.

A third terminal of and a second terminal of the eleventh TFT NT11 are connected together and to a reset signal RESET, and a first terminal of the eleventh TFT NT11 is connected to the third terminal of the seventh TFT NT7.

Preferably, all the thin film transistors of the GOA unit are N-channel thin film transistors.

Preferably, after the liquid crystal display panel is powered off, the forward scanning control signal U2D, the backward scanning control signal D2U and all the clock signals are at a low level, and the first global control signal is at a high level.

Figure 3:
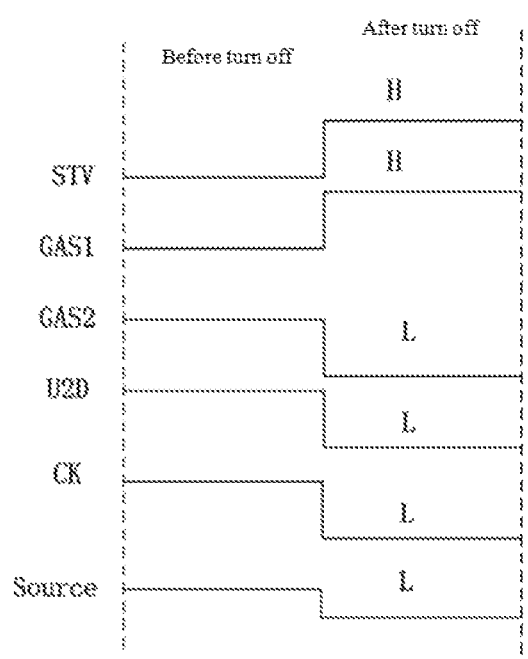
FIG. 3 is a timing chart of each signal when the liquid crystal display panel according to the present invention is powered off.

When the liquid crystal display panel is powered off, the timing chart of each signal is shown in FIG. 3. Both the scan enabling signal STV and the first global control signal GAS1 are high level (H). The second global control signal GAS2, the forward scanning control signal U2D, all clock signals CK are low level (L). When the potential of the gate of the fifth thin film transistor NT5 is at a high level which turns on the fifth thin film transistor NT5, the second global control signal GAS2 is applied to the gate of the seventh thin film transistor NT7. On the other hand, the eighth thin film transistor NTS is turned on, the low level signal VGL is also applied to the gate of the seventh TFT NT7, The gate potential of the seventh TFT NT7 thus become a superposition of the potentials of the second global control signal GAS2 and the low potential signal VGL, so that the seventh thin film transistor NT7 will not be turned on. It can also be seen from FIG. 3 that the potential of the data line SOURCE also become a low level.

The GOA circuit in the present invention can be applied with the forward scanning way, i.e., the forward scanning control signal U2D being at a high level and the backward scanning control signal D2U is at a low level, or the backward scanning way, i.e., the forward scanning control signal U2D is at a low level and the backward scanning control signal D2U is at a high level, of the liquid crystal display panel. The thin film transistors of the pixel units can be turned on row by row, and an All Gate ON function can be realized when the liquid crystal display panel is abnormally powered off.

In view of the above, in the present invention, by means of inputting the second global control signal GAS2 to the first terminal of the fifth TFT NT5, the second global control signal GAS2 becomes a low level when the liquid crystal display panel is powered off. Thus, even though the fifth thin film transistor NT5 is turned on in such a situation and the second global control signal GAS2 is transmitted to the seventh thin film transistor NT7, the low-level signal VGL will flow into the gate of the seventh thin film transistor NT7 through the eighth thin film transistor NTS, The low-level signal VGL thus superimpose the second global control signals GAS2 and turn off the seventh thin film transistor NT7, which can prevent the low-level signal VGL from pulling down the potential of the gate driving signal G(n) of stage n, thereby avoiding insufficient opening of the thin film transistor of the pixel unit resulted from that the gate driving signal G(n) of stage n is pulled low, Therefore, in the present application, the pixel switches of the liquid crystal display panel can be fully opened to release the charge on the pixel electrodes in time, and the charge of the pixel electrodes can be led out through the data lines of the liquid crystal display panel, which in turn eliminates a ghost image in the liquid crystal display panel that appears when the electricity is powered off, and improve user experience.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A GOA circuit, applied to a liquid crystal display panel and comprising m cascaded GOA units, wherein an n-th GOA unit includes an output control module, a forward and backward scanning control module, a node signal control module, a second pull-down circuit, a first pull-down circuit and a pull-up circuit, where m≥n≥1, and wherein the forward and backward scanning control module is configured to control the GOA circuit to perform a forward scanning or a backward scanning according to a forward scanning control signal or a backward scanning control signal;

the output control module is connected to the forward and backward scanning control module and is configured to control an output of an n-th gate driving signal during the forward scanning or the backward scanning in the GOA circuit;

the first pull-down circuit comprises a seventh thin film transistor, a first terminal of the seventh thin film transistor is connected with the output control module, and a second terminal of the seventh thin film transistor is connected with a low-level signal;

the second pull-down circuit comprises a fifth thin film transistor, a first terminal of the fifth thin film transistor is connected to a second global control signal, and a second terminal of the fifth thin film transistor is connected to a third terminal of the seventh thin film transistor;

the node signal control module is connected to a third terminal of the fifth thin film transistor and configured to output a clock signal to the fifth thin film transistor so as to control the ON-OFF of the fifth thin film transistor;

the pull-up circuit includes an eighth thin film transistor having a first terminal connected to the third terminal of the seventh thin film transistor, a second terminal and a third terminal respectively connected to a low-level signal and a first global control signal; and the first terminal is one of a source and a drain, the second terminal is the other of the source and the drain, and the third terminal is a gate, and after the liquid crystal display panel is powered off, the second global control signal is at a low level.

2. The GOA circuit as claimed in claim 1, wherein the pull-up circuit further comprises a thirteenth TFT; and a first terminal and a third terminal of the thirteenth TFT are both connected to the third terminal of the eighth TFT, and a second terminal of the thirteenth TFT is connected to the first terminal of the seventh TFT.

3. The GOA circuit as claimed in claim 1, wherein the GOA unit further comprises a voltage regulator circuit, wherein the voltage regulator circuit comprises a ninth TFT, the output control module comprises a sixth TFT, and the forward and backward scanning control module comprises a first TFT and a second TFT;

a first terminal of the first thin film transistor is connected to a forward scanning control signal and a second terminal of the first thin film transistor is connected to a first terminal of the ninth thin film transistor;

a third terminal of the ninth thin film transistor is connected with a high-level signal, and a second terminal of the ninth thin film transistor is connected with a third terminal of the sixth thin film transistor;

a first terminal of the sixth thin film transistor is connected to an n-th clock signal, a second terminal of the sixth thin film transistor is connected to the first terminal of the seventh thin film transistor, and a connection point of the sixth thin film transistor and the seventh thin film transistor works as an output terminal of a gate drive signal of stage n;

a first terminal of the second thin film transistor is connected with a backward scanning control signal, and a second terminal of the second thin film transistor is connected with a second terminal of the first thin film transistor; and wherein, when n>2, the third terminal of the first thin film transistor is inputted by a gate driving signal of stage n−2, and when n≤2, the third terminal of the first thin film transistor is inputted by a scan enabling signal;

when n≤m−2, the third terminal of the second thin film transistor is inputted by a gate driving signal of stage n+2, and when n>m−2, the third terminal of the second thin film transistor is inputted by the scan enabling signal; and after the liquid crystal display panel is powered off, the scan enabling signal is at a high level.

4. The GOA circuit as claimed in claim 3, wherein the node signal control module comprises a third thin film transistor and a fourth thin film transistor;

a first terminal of the third TFT is inputted by an (n+1)th clock signal, a third terminal of the third TFT is inputted by a forward scan control signal, and a second terminal of the third TFT is connected to a third terminal of the fifth thin film transistor; and a first terminal of the fourth thin film transistor is inputted by an (n−1)th clock signal, a third terminal of the fourth TFT is inputted by a backward scanning control signal, and a second terminal of the fourth thin film transistor is connected with a third terminal of the fifth thin film transistor.

5. The GOA circuit as claimed in claim 4, wherein the GOA circuit has four clock signals including a first clock signal, a second clock signal, a third clock signal and a fourth clock signal, and wherein when the n-th clock signal is the fourth clock signal, the (n+1)th clock signal is the first clock signals, and when the n-th clock signal is the first clock signal, the (n−1)th clock signal is the fourth clock.

6. The GOA circuit as claimed in claim 4, wherein the GOA circuit has four clock signals including a first clock signal, a second clock signal, a third clock signal and a fourth clock signal, and wherein when the n-th clock signal is the fourth clock signal, the (n+1)th clock signal is the first clock signals, and when the n-th clock signal is the first clock signal, the (n−1)th clock signal is the fourth clock.

7. The GOA circuit as claimed in claim 3, wherein the GOA unit further comprises a first capacitor, a second capacitor and a tenth thin film transistor; and wherein a third terminal of the tenth thin film transistor is connected to the second terminal of the fifth thin film transistor, a first terminal and a second terminal of the tenth thin film transistor are respectively connected to the first terminal of the ninth thin film transistor and a low-level signal;

both ends of the first capacitor are respectively connected to a first terminal of the ninth TFT and a low-level signal; and both ends of the second capacitor are respectively connected to the third terminal and the second terminal of the seventh TFT.

8. The GOA circuit as claimed in claim 3, wherein the GOA unit further comprises a twelfth thin film transistor and an eleventh thin film transistor, and wherein a third terminal of the twelfth thin film transistor is connected to the second terminal of the first thin film transistor and the second terminal of the second thin film transistor, and a second terminal and a first terminal of the twelfth thin film transistor are respectively connected to a low-level signal and a third terminal of the seventh thin film transistor; and a third terminal of and a second terminal of the eleventh TFT are connected together and to a reset signal, and a first terminal of the eleventh TFT is connected to the third terminal of the seventh TFT.

9. The GOA circuit as claimed in claim 1, wherein all the thin film transistors of the GOA unit are N-channel thin film transistors.

10. The GOA circuit as claimed in claim 1, wherein after the liquid crystal display panel is powered off, the forward scanning control signal, the backward scanning control signal and all the clock signals are at a low level, and the first global control signal is at a high level.

11. A GOA circuit, applied to a liquid crystal display panel and comprising m cascaded GOA units, wherein an n-th GOA unit includes an output control module, a forward and backward scanning control module, a node signal control module, a second pull-down circuit, a first pull-down circuit and a pull-up circuit, where m≥n≥1, and wherein the forward and backward scanning control module is configured to control the GOA circuit to perform a forward scanning or a backward scanning according to a forward scanning control signal or a backward scanning control signal;

the output control module is connected to the forward and backward scanning control module and is configured to control an output of an n-th gate driving signal during the forward scanning or the backward scanning in the GOA circuit;

the first pull-down circuit comprises a seventh thin film transistor, a first terminal of the seventh thin film transistor is connected with the output control module, and a second terminal of the seventh thin film transistor is connected with a low-level signal;

the second pull-down circuit comprises a fifth thin film transistor, a first terminal of the fifth thin film transistor is connected to a second global control signal, and a second terminal of the fifth thin film transistor is connected to a third terminal of the seventh thin film transistor;

the node signal control module is connected to a third terminal of the fifth thin film transistor and configured to output a clock signal to the fifth thin film transistor so as to control the ON-OFF of the fifth thin film transistor;

the pull-up circuit includes an eighth thin film transistor having a first terminal connected to the third terminal of the seventh thin film transistor, a second terminal and a third terminal respectively connected to a low-level signal and a first global control signal;

the pull-up circuit further comprises a thirteenth TFT;

a first terminal and a third terminal of the thirteenth TFT are both connected to the third terminal of the eighth TFT, and a second terminal of the thirteenth TFT is connected to the first terminal of the seventh TFT; and wherein the first terminal is one of a source and a drain, the second terminal is the other of the source and the drain, and the third terminal is a gate, and after the liquid crystal display panel is powered off, the second global control signal is at a low level.

12. The GOA circuit as claimed in claim 11, wherein the GOA unit further comprises a voltage regulator circuit, wherein the voltage regulator circuit comprises a ninth TFT, the output control module comprises a sixth TFT, and the forward and backward scanning control module comprises a first TFT and a second TFT;

a first terminal of the first thin film transistor is connected to a forward scanning control signal and a second terminal of the first thin film transistor is connected to a first terminal of the ninth thin film transistor;

a third terminal of the ninth thin film transistor is connected with a high-level signal, and a second terminal of the ninth thin film transistor is connected with a third terminal of the sixth thin film transistor;

a first terminal of the sixth thin film transistor is connected to an n-th clock signal, a second terminal of the sixth thin film transistor is connected to the first terminal of the seventh thin film transistor, and a connection point of the sixth thin film transistor and the seventh thin film transistor works as an output terminal of a gate drive signal of stage n;

a first terminal of the second thin film transistor is connected with a backward scanning control signal, and a second terminal of the second thin film transistor is connected with a second terminal of the first thin film transistor; and wherein, when n>2, the third terminal of the first thin film transistor is inputted by a gate driving signal of stage n−2, and when n≤2, the third terminal of the first thin film transistor is inputted by a scan enabling signal;

when n≤m−2, the third terminal of the second thin film transistor s inputted by a gate driving signal of stage n+2, and when n>m−2, the third terminal of the second thin film transistor is inputted by the scan enabling signal; and after the liquid crystal display panel is powered off, the scan enabling signal is at a high level.

13. The GOA circuit as claimed in claim 12, wherein the node signal control module comprises a third thin film transistor and a fourth thin film transistor;

a first terminal of the third TFT is inputted by an (n+1)th clock signal, a third terminal of the third TFT is inputted by a forward scan control signal, and a second terminal of the third TFT is connected to a third terminal of the fifth thin film transistor; and a first terminal of the fourth thin film transistor is inputted by an (n−1)th clock signal, a third terminal of the fourth TFT is inputted by a backward scanning control signal, and a second terminal of the fourth thin film transistor is connected with a third terminal of the fifth thin film transistor.

14. The GOA circuit as claimed in claim 12, wherein the GOA unit further comprises a first capacitor, a second capacitor and a tenth thin film transistor; and wherein a third terminal of the tenth thin film transistor is connected to the second terminal of the fifth thin film transistor, a first terminal and a second terminal of the tenth thin film transistor are respectively connected to the first terminal of the ninth thin film transistor and a low-level signal;

both ends of the first capacitor are respectively connected to a first terminal of the ninth TFT and a low-level signal; and both ends of the second capacitor are respectively connected to the third terminal and the second terminal of the seventh TFT.

15. The GOA circuit as claimed in claim 12, wherein the GOA unit further comprises a twelfth thin film transistor and an eleventh thin film transistor, and wherein a third terminal of the twelfth thin film transistor is connected to the second terminal of the first thin film transistor and the second terminal of the second thin film transistor, and a second terminal and a first terminal of the twelfth thin film transistor are respectively connected to a low-level signal and a third terminal of the seventh thin film transistor; and a third terminal of and a second terminal of the eleventh TFT are connected together and to a reset signal, and a first terminal of the eleventh TFT is connected to the third terminal of the seventh TFT.

16. The GOA circuit as claimed in claim 11, wherein all the thin film transistors of the GOA unit are N-channel thin film transistors.

17. The GOA circuit as claimed in claim 11, wherein after the liquid crystal display panel is powered off, the forward scanning control signal, the backward scanning control signal and all the clock signals are at a low level, and the first global control signal is at a high level.

\* \* \* \* \*